United States Patent [19]

Bird

[11] Patent Number: 4,464,655
[45] Date of Patent: Aug. 7, 1984

[54] TESTCASE GENERATOR WITH MARKER SYMBOLS DISPLAYED WITH PRIMARY DATA

[75] Inventor: David L. Bird, Eastleigh, England

[73] Assignee: International Business Machines Corporation, Armonk, N.Y.

[21] Appl. No.: 318,296

[22] Filed: Nov. 5, 1981

[30] Foreign Application Priority Data

Nov. 26, 1980 [EP] European Pat. Off. ........... 80304231

[51] Int. Cl.³ ............................................. G09G 1/00
[52] U.S. Cl. .................................... 340/715; 340/724; 340/734
[58] Field of Search ............... 340/715, 705, 723, 724, 340/734

[56] References Cited

U.S. PATENT DOCUMENTS 3,286,083 11/1966 Nielsen ................................. 340/724
3,742,288 6/1973 Albrecht et al. ..................... 340/724
3,753,032 8/1973 Naidich et al. ...................... 340/715
4,295,135 10/1981 Sukonick .............................. 340/734

FOREIGN PATENT DOCUMENTS 0009828 4/1980 European Pat. Off. .
1510240 5/1978 United Kingdom .

OTHER PUBLICATIONS

IBM Tech. Discl. Bull., vol. 16, No. 7, 12/73, Doehle et al., *Diagnosis of Addressing Errors in Display Devices;* pp. 2244–2247.

Primary Examiner—Marshall M. Curtis
Attorney, Agent, or Firm—W. S. Robertson

[57] ABSTRACT

A digital data display system including a testcase generator which generates testcase programs. Testcase programs include primary data which may be displayed in alphanumeric or graphic form and secondary data which is used to provide a visible check that the primary data has been displayed correctly. The generator also includes checking code with each testcase program so that the tests are self-checking.

3 Claims, 7 Drawing Figures

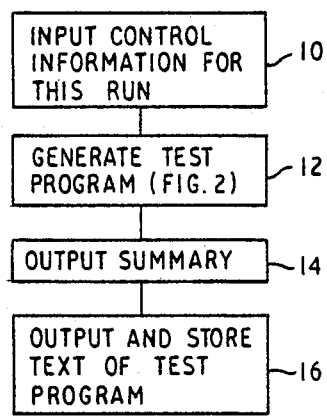
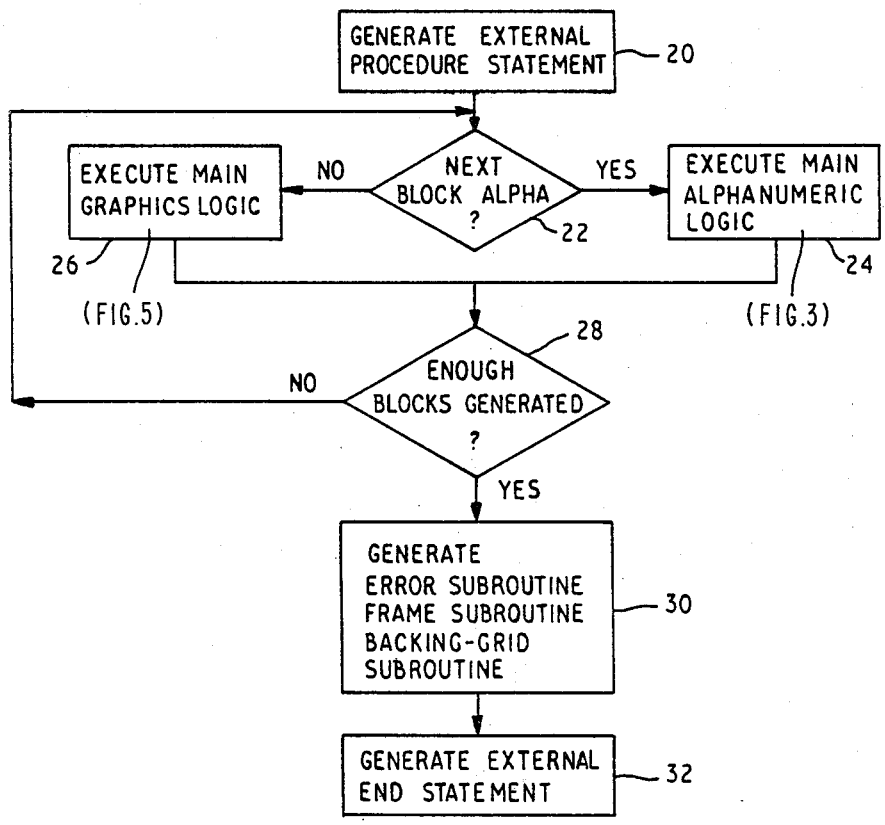

TESTCASE GENERATOR WITH MARKER SYMBOLS DISPLAYED WITH PRIMARY DATA

SUMMARY OF THE INVENTION

The invention relates to a digital data display system capable of displaying both alphanumeric and graphic data. The invention finds particular use in a system such as described in European Patent Application No. 80103734.2 in which the control signals for graphic and alphanumeric displays are generated at a central processing device and then transmitted to visual display units (v.d.u's) which may be at remote locations.

BACKGROUND OF THE INVENTION

One problem associated with any data processing system is rigorous testing to ensure that the system operates within its design parameters. The most common form of testing is to use testcase programs which test particular aspects of the system. To write a testcase program by hand will require two to four weeks and as the number of testcase programs to test a system will be in the order of a thousand it can be seen that to manually produce testcase programs suitable for checking a large scale system requires a very large amount of effort.

United Kingdom Pat. Specification Nos. 1,479,122 and 1,510,240 describe methods of operating a computer to produce testcase programs.

U.K. Pat. Specification No. 1,479,122 describes a method of producing testcase programs in which statements are generated on a weighted random basis and a prediction is made to the value of variables changed during the operation of each statement. The programs produced by the method are suitable for testing the data calculating and manipulating aspects of a compiler Program. U.K. Pat. Specification No. 1,510,240 describes a method of producing testcase programs suitable for testing the input-output instruction handling capabilities of a compiler.

When a compiler is tested, the results of the run of a testcase appear either as a series of error messages at an I/O terminal or in a printout from a printer. An analysis of such messages gives an indication of any faults in the system.

OBJECTS OF THE INVENTION

The testing of a data display system however requires different techniques to be used as any errors in the system will not necessarily result in error messages but instead will cause incorrect data to be displayed at the v.d.u.'s.

A generated testcase contains three different types of statements:
  (a) Structural statements, e.g., PROC, END, error subroutine, backing-grid subroutine, float-compare subroutine;
  (b) Random data display system statements;
  (c) Intermingled self-checking statements, some of which may in fact be data display system statements.

The major part of each testcase naturally consists of the random data display system statements. For each random statement that the generator produces, it must fulfill the following tasks:
  (1) Produce the text of the statement, which must be valid and executable without error.
  (2) Predict its execution and register all significant information in the generator's internal control blocks.
  (3) Cater for the eventual checking of the correct execution. This should be self-checking by the generated testcase wherever possible.

This third objective is most difficult to achieve in the area of graphics testing, since most errors display themselves in the form of incorrect output to the device at testcase execution time.

SUMMARY OF THE INVENTION

According to the invention there is provided a digital data display system in which alphanumeric and graphic data displays are constructed in a data processing device and displayed at a display terminal including a testcase generator for generating and storing testcase programs characterized in that the testcase generator include means to generate testcase programs which includes primary data to be displayed and secondary data including marker symbols arranged to appear in a predetermined position relative to the primary data on display terminal whereby when the primary data is displayed, if the marker symbol is not in its predetermined position, an error condition is indicated.

In order that the invention may be fully understood, a preferred embodiment thereof will now be described with reference to the accompanying drawings.

BRIEF DESCRIPTION OF THE DRAWINGS

FIG. 1 is a flow diagram showing the principle steps in generating testcase programs.

FIG. 2 is a flow diagram expanding one of the steps of FIG. 1.

DETAILED DESCRIPTION

Introduction

Figure 3:
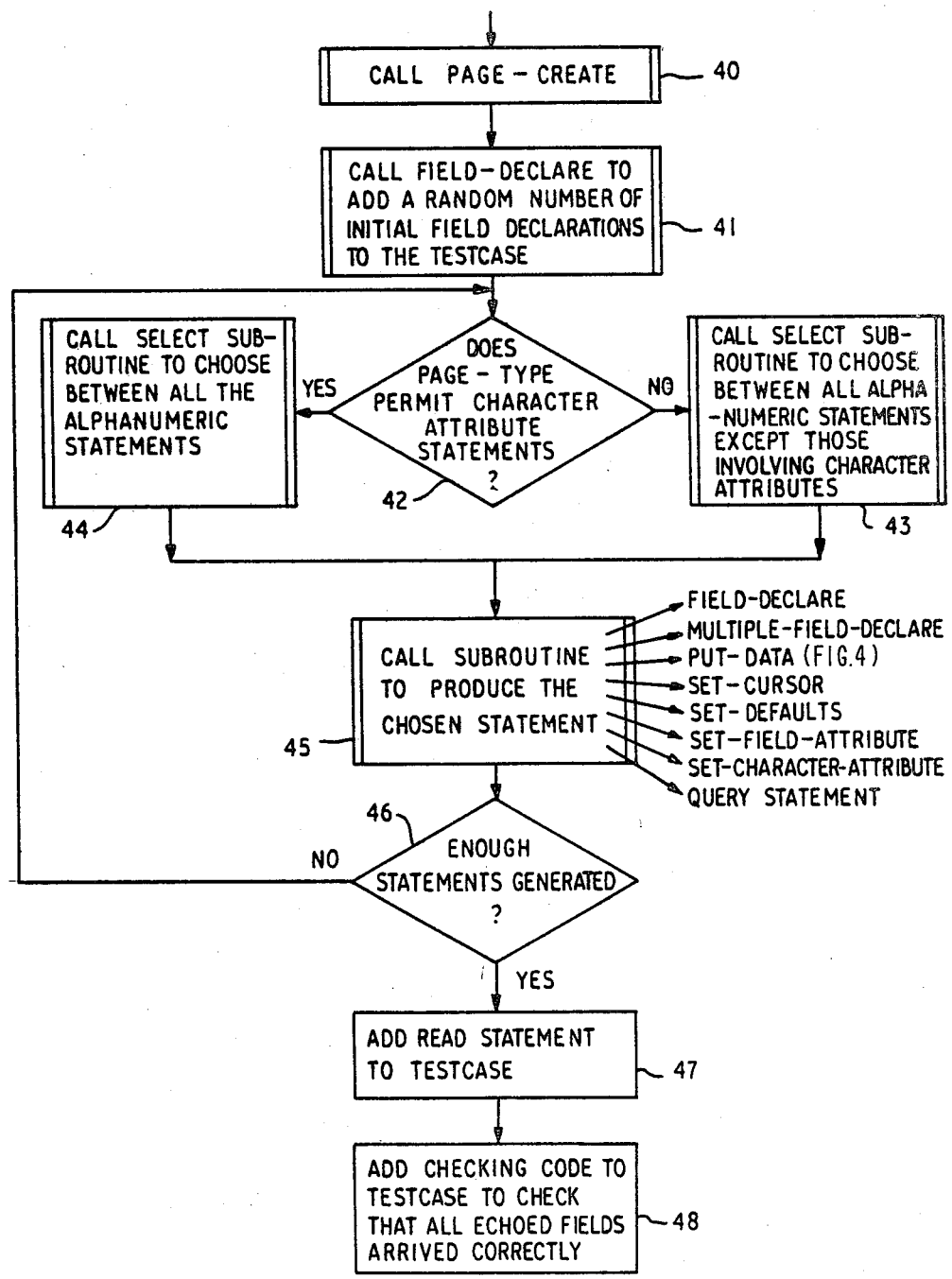
FIG. 3 is a flow diagram expanding one of the steps of FIG. 2.

The embodiment of the invention described below is described with reference to statements and commands used in the Graphical Data Display Manager (GDDM) and Presentation Graphics Feature (PGF) data display system marketed by International Business Machines Corporation. For a full understanding of the system and the commands and statements reference should be made to GDDM and PGF General Information Manual (GS33-0100) and GDDM Users Guide (SC33-0101) both published by International Business Machines Corporation.

In broad terms, testcase programs are generated automatically using the principles set out in the aforementioned U.K. Pat. Specification No. (1,479,122) with the addition of statements for output secondary information. This secondary information is of two types. When a testcase program is generated to test the alphanumeric capabilities of a digital data display system, then certain parts of the terminal output from the testcase are 'echoed' back and automatically checked by the testcase itself. Thus, for example, a generated character field may include a series of identical alphanumeric check characters with a special echo-prompt character '?' in a particular position. When this is displayed at the terminal, the user overwrites the '?' with the check character, for example, a 'Q'. The testcase program then issues a READ command and all modified contents of the terminal display screen are read back to the main processor. The testcase program then checks that the predicted number of fields arrives back and that all the special characters have been overwritten correctly. If not, an error condition is signalled.

The second type of secondary information is for use when the graphic capabilities of the digital display system are being tested. When the testcase generator produces statements that define the generation of a primitive (line or arc) then it remembers the predicted endpoints of each primitive. When the completed display is transmitted to the terminal, special marker symbols are sent to the predicted primitive endpoints and displayed on the screen. Thus, a visual check can be made to determine that all displayed primitives start and end with marker symbols and that there are no marker symbols unattached to lines or arcs. A check can also be made to see that all generated graphic fall within a particular display window defined by the testcase.

The preferred embodiment of the invention will now be more particularly described.

The Testcase Generator—FIG. 1

FIG. 1 shows the main steps involved in generating a testcase program, these steps are executed in the main processing device of the digital data display system. The process involved in this generation is referred to as the testcase generator.

The generator has four main processes each of which may be divided into may subsidiary actions. FIG. 1, box 10 shows that the initial step for the user is to enter, into the digital display system control, information for the particular run. This will include the weighting factors for the types of instruction to appear in the testcase program, an indication of the total number of instructions of the testcase program, and the number of alphanumeric and graphic display blocks to be produced. This information is entered into the system at a terminal display device such as the IBM 3279 color display. (IBM is a Registered Trademark). As soon as the information is entered, then the next process 12 is begun.

Process 12 is to generate the statements of the testcase program, predict their operation and values of variables and store the text of the statements on a direct access file for later re-ordering. Details of the generation will be described with reference to FIG. 2 below.

Process 14 is the production of an output summary which includes as a comment in the testcase program details of the contents of the generated testcase program including the number of statements and blocks generated and the frequency of various types of statement or block. This summary can be accumulative and can give a picture of the contents of a suite of testcase programs.

The final process 16 is the output of the generated testcase program as a program stored in a disc file attached to the system where it is ready to be used to test the system.

The Generate Test Program Process—FIG. 2

FIG. 2 is a flow chart which shows the steps of the 'generate test program' process 12 of FIG. 1 in more detail. The first Step 20 is to generate an external procedure statement for the testcase program. This will be standard for the particular programming language employed. For PL/1 this will be the form: Program name followed by: PROCEDURE OPTIONS(MAIN). The next Step 22 is to determine whether the next block of statements to be generated will be for a graphic or an alphanumeric display. The decision will be taken on a random basis with a weighting determined by the input control information entered at Step 10 (FIG. 1). If the decision is to generate an alphanumeric block, then process Step 24 is entered. If the decision is for a graphic block then process Step 26 is entered. Step 24 is described in more detail below with reference to FIGS. 3 and 4. Step 26 is described below in more detail with reference to FIGS. 5 and 6.

When either Step 24 or 26 is concluded, then a decision Step 28 is entered. Step 28 is to determine whether or not enough blocks for the particular testcase have been generated. The information for this decision is input as part of Step 10 (FIG. 1). If the required number of blocks has not been generated, then Step 22 is re-entered. If there are enough, then Step 30 is entered.

Step 30 is to generate the standard routines for error handling, providing a frame for a displayed picture and a backing grid for a graphic display. Although these routines are not necessarily generated for each testcase, the routines themselves are not random.

The final Step 32 is to generate an external end statement.

The Execute Main Alphanumeric Logic Process—FIG. 3

FIG. 3 shows the main steps in the Execute Main Alphanumeric Logic process Step 24 (FIG. 2). The main purpose of this process is to generate statements that will result in alphanumeric data being displayed at a terminal with certain characters that will be identified by a user and either overwritten by typing into a keyboard or designated by using a light pen directed at the screen. All modified fields are sent back to the testcase and checked. If they are incorrect, an error condition is signalled.

The first Step 40 is to call a Page Create subroutine. This routines provides the text of a page create statement. The statement defines how many rows and columns are to be used in the page and internal control blocks in the generator, which are used to ensure that generated statements are executable, are set to reflect these parameters.

The next Step 41 is to call a subroutine to add a random number of field declarations to the testcase. The subroutine is given the title FIELD DECLARE and is called at this point in the process to ensure that when statements are generated randomly later on ther will always be at least one valid field declaration.

Step 42 is to determine whether or not the page type created at Step 40 permits character attribute statements. If no, Step 43 is entered; if yes, Step 44 is entered.

Figure 4:
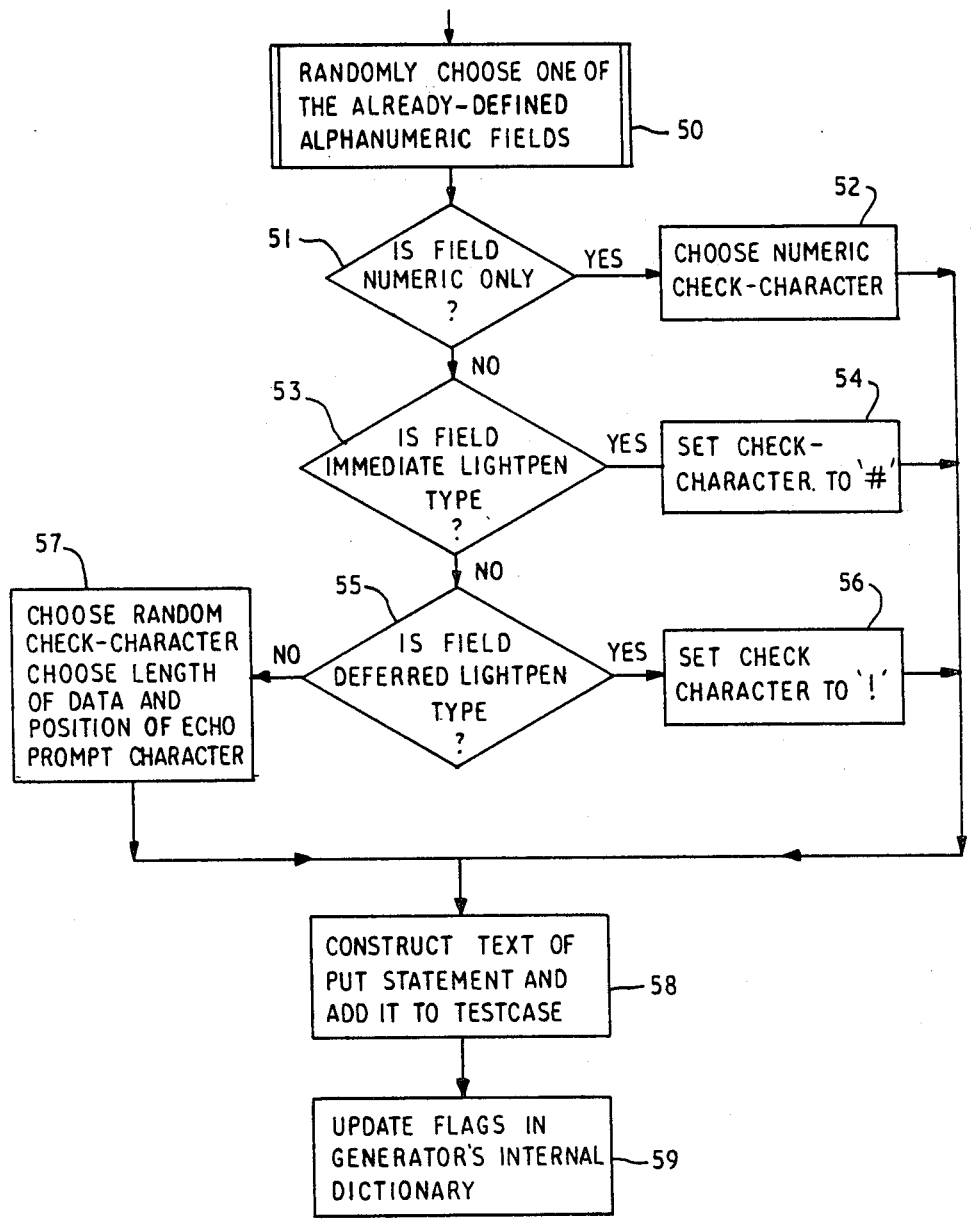
FIG. 4 is a flow diagram expanding one of the steps of FIG. 3.

Step 43 is to call a subroutine called SELECT to choose between all alphanumeric statements except those involving character attributes. Similarly, Step 44 calls the SELECT subroutine to choose one statement from all the alphanumeric statements. Step 45 calls for specific statement generation subroutine to generate the chosen statement. The generation of different statements involves similar processes. FIG. 4 shows an example of the generation of the alphanumeric PUT statement and will be described below.

The types of statement that may be generated at Step 45 are listed in FIG. 3 and include FIELD-DECLARE, MULTIPLE FIELD DECLARE, PUT DATA, SET CURSOR, SET DEFAULTS, set field attributes, set character attributes and Query statement. The principles involved in generating these statements are the same as those followed in the generation of the PUT statement described with reference to FIG. 4.

At the conclusion of Step 45, Step 46 is entered to determine whether or not enough statements have been generated. If not, then Step 42 is re-entered. If yes, then Step 47 is entered. Step 47 is to add a READ statement to the testcase and Step 48 is to add checking code to the testcase to check that all echoed fields arrive correctly.

A Statement Example—FIG. 4

FIG. 4 is a flow chart of the process involved in generating an alphanumeric PUT statement. The first Step 50 in the process is to randomly choose one of the already defined alphanumeric fields (Step 41, FIG. 3).

If the field is numeric only at Step 51 a decision is taken to enter Step 52. Step 52 is to choose a numeric check character, that will eventually appear in the display screen for the user to overwrite and be 'echoed' back when the Read statement (Step 48, FIG. 3) is executed.

If the field has the attribute 'immediate light pen' then at Step 53, the decision is taken to enter Step 54 which sets the check character to the '#' symbol.

If the field is a 'deferred light pen' type then the decision at Step 55 is to enter Step 56 and set the check character to the symbol '!'.

If the field is not one of the above types, then Step 57 is entered. Step 57 is to choose a random check character then choose the length of data and position in the field of the echo prompt character.

At the conclusion of Steps 54, 55, 56 or 57, Step 58 is entered. Step 58 is to construct the text of the PUT statement and add it to the testcase. This is followed by Step 59 which updates the testcase generator's internal dictionary so that the checking of the echoed data can be monitored efficiently.

Figure 5:
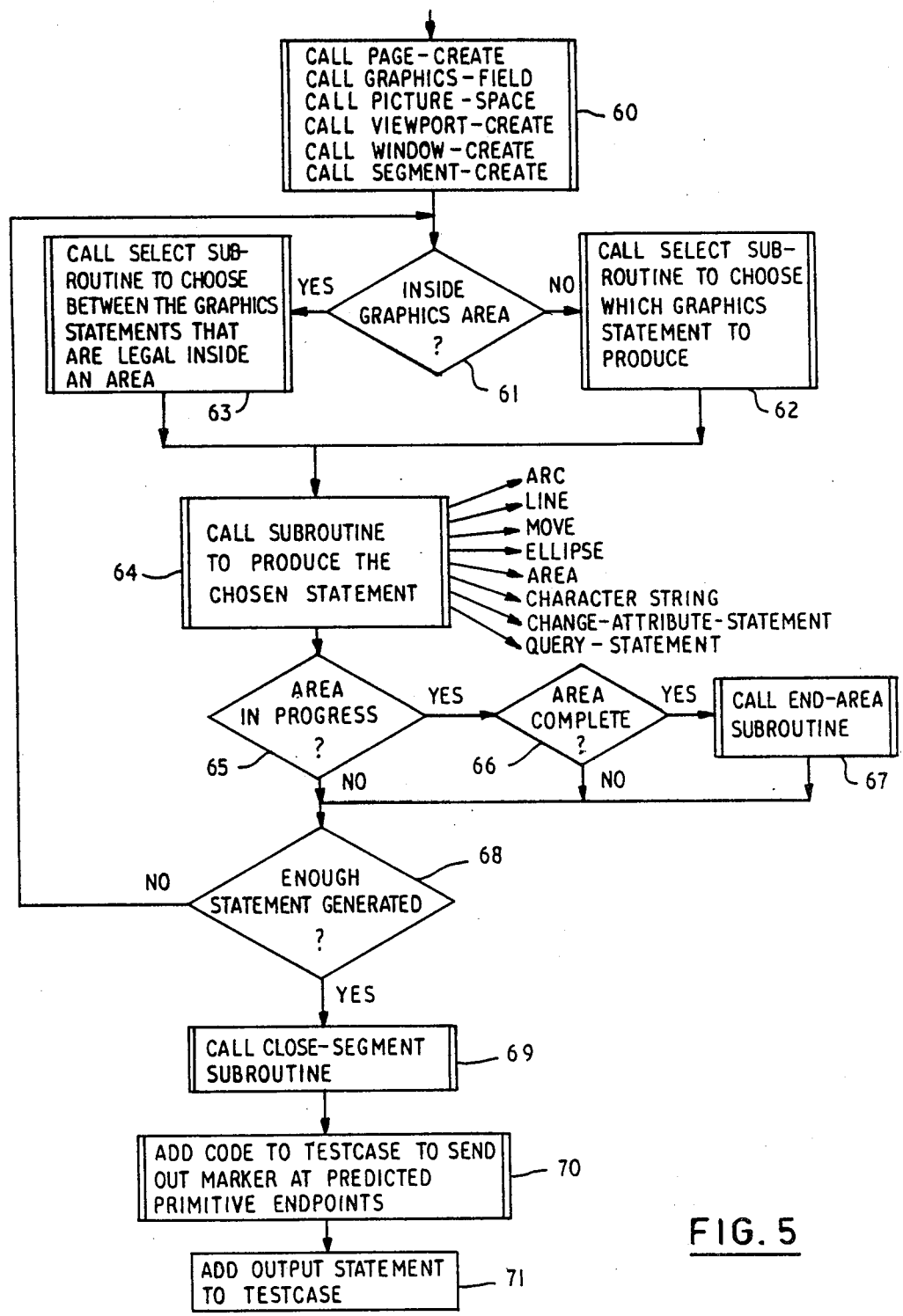
FIG. 5 is a flow diagram expanding one of the steps of FIG. 2.

The Execute Main Graphics Logic Step—FIG. 5

FIG. 5 shows the main steps in the execute main graphics logic step (26, FIG. 2). The first step 60 in the process is to create the various parameters that are needed to define a graphic display. These are created by calling a series of subroutines which generate first of all the page create parameters which are similar to the page create routine of the alphanumeric process. Other routines define the graphics field, the picture space, the viewport and window to be used and the segment in which the graphic picture is to be drawn.

The next Step 61 in the process is to decide whether or not a graphics area is in the process of being constructed. For the first statement generated, the answer to this question will always be no and Step 62 will then be entered. Step 62 is a process to determine which graphic statement would be produced. This is done on a weighted random generator basis. If in Step 61 it had been determined that a graphics area was in the process of being constructed, Step 63 is entered to choose between graphic statements that are valid inside a graphics area.

After either Step 62 or 63 is concluded, Step 64 calls the routine to generate the chosen statement. The generation of the arc statement which is typical of generation of other primitive lines is described above with reference to FIG. 6.

The other types of statement that could be called are listed on FIG. 5 and include LINE, MOVE, ELLIPSE, AREA, CHARACTER STRING, change attribute statement, and Query statement. All these will be given a weighting value depending upon the particular feature under test and then chosen randomly. The generation of each statement follow the principles described with reference to FIG. 6 and the generation of an ARC statement.

When the statement has been generated, Step 65 is entered to determine whether or not an area is still being constructed. If the answer is yes, then Step 66 is to determine whether or not the area is completed. If the area is complete, then Step 67 is entered which is a routine to add the end area statement to the testcase. If the decision made in Step 65 or 66 is no, then Step 68 is entered. Step 68 is also entered at the conclusion of Step 67.

Step 68 is to determine whether or not enough statements have already been generated. If there have not been enough, then Step 61 is re-entered. If there have been enough, then Step 69 is entered. Step 69 is a process to close the segment which was created in Step 60. This is followed at Step 70 which adds the statements to the testcase to send out markers at predicted primitive endpoints. Step 71 follows which adds an output statement to the testcase.

Figure 6:
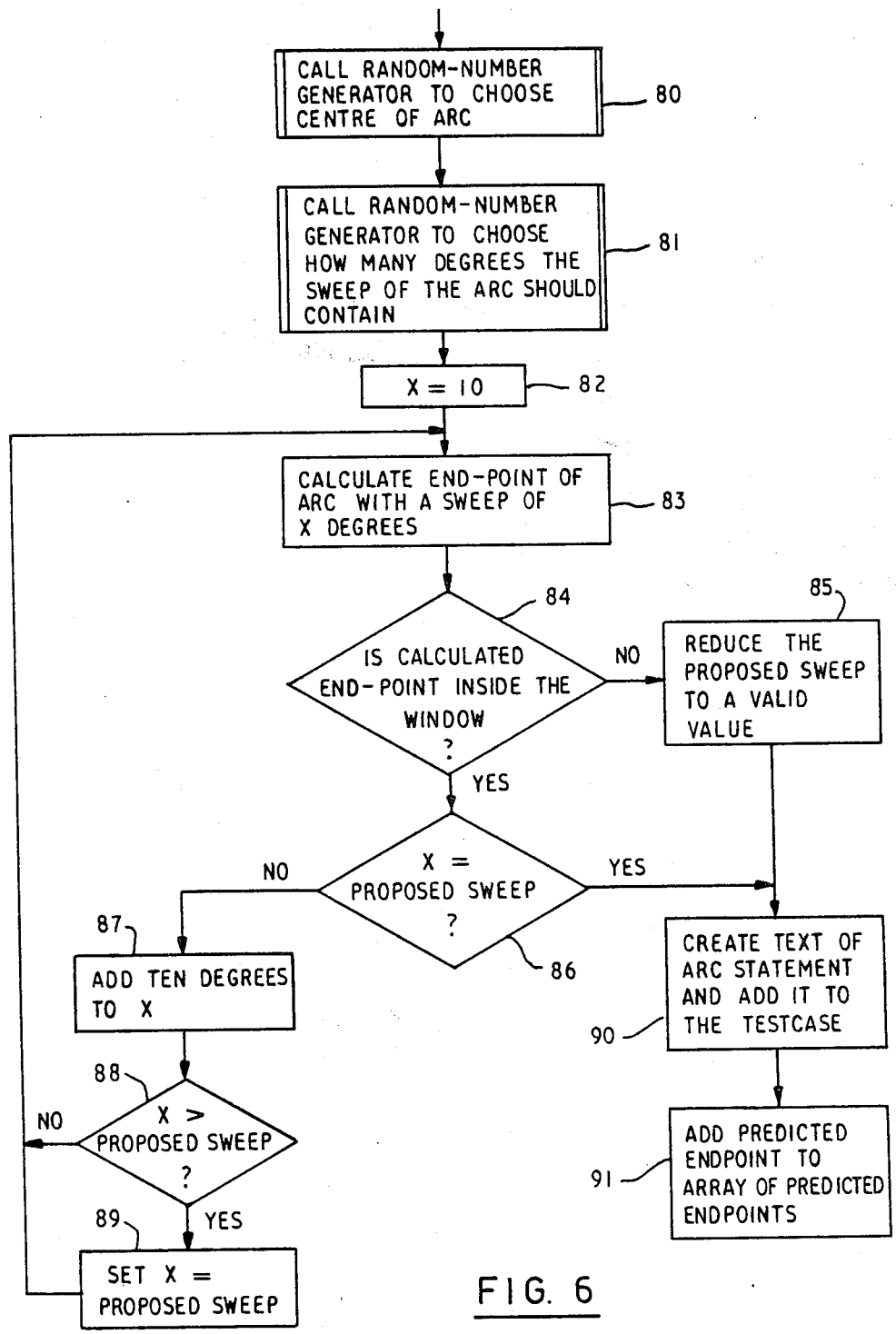
FIG. 6 is a flow diagram expanding one of the steps of FIG. 5.

Generating an Arc Statement—FIG. 6

FIG. 6 is a flowchart of the process involved in generating an ARC statement. In the GDDM system, an arc is defined as a sweep of X degrees starting at one endpoint with a defined center point. The first Step 80 in the process is therefore to choose a center of the arc, by using a random number generator to provide valid coordinate points. The second Step 81 is to use the random number generator to choose how many degrees of sweep the arc would contain.

In order to provide a valid arc statement, it is necessary to check that the defined arc does not pass outside the window area defined in Step 60 (FIG. 5). Steps 82–89 are concerned with this checking.

Step 82 is to initially set X (the number of degrees of sweep) to 10. Step 83 is to calculate the endpoint of the arc with a sweep of X degrees. Step 84 is to calculate whether the endpoint is inside the window. If the answer is no, then Step 85 is to reduce the value of X to a valid value. This is achieved by subtracting a number from 10 to 19 randomly chosen from the current value of X. If the endpoint is within the window, then Step 86 is to determine whether or not X equals the proposed sweep chosen at Step 81.

When X equals the proposed sweep, then Steps 90 and 91 are entered. If not, then Step 87 adds 10 degrees to the value of X. Step 88 determines whether or not X is greater than the proposed sweep, if no, then Step 83 is re-entered; if yes, then Step 80 sets X equal to the number chosen at Step 81 before Step 83 is re-entered.

Step 90 is to create the text of the ARC statement and add it to the testcase. Step 91 is concerned with adding the predicted endpoint to an array of endpoints held in the testcase generator.

When a primitive (line or arc) is generated, the testcase generator adds the coordinates of the primitive's predicted endpoint to an array. These coordinates are then used to generate endpoint marker symbols which are transmitted to the display device by a statement in the testcase immediately prior to the READ. The marker symbols should all occur at the endpoints of lines on the display. A visual check will indicate whether or not this is the case. Obviously, a marker symbol unattached to a line or a line without a marker symbol indicates an error in the system.

Figure 7:
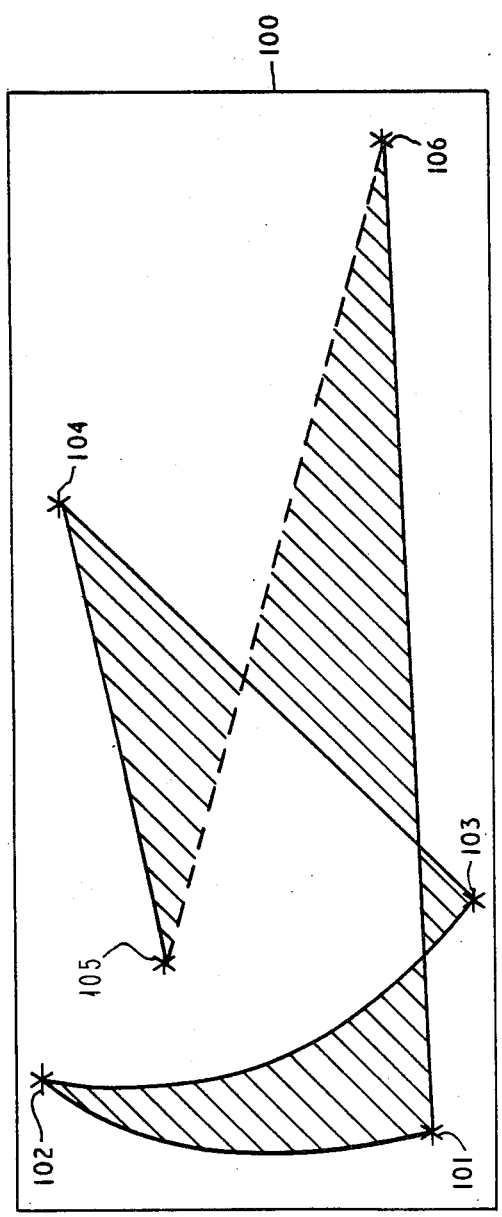
FIG. 7 illustrates a typical testcase generated display.

A Graphical Test Case Example—FIG. 7

FIG. 7 illustrates a typical graphical testcase output as it appears on a display screen. The area 100 is the window defined at Step 60 (FIG. 5). In this case, the subroutine chosen initially at Step 62 (FIG. 5) is assumed to be an AREA, consequently, the succeeding primitives will then define an area. 101 is the starting point and the first primitive drawn is an arc which ends at point 102. Marker symbols shown on the drawing as asterisks are generated for the points 101 and 102. The second primitive is an arc which ends at point 103. From the position of 103 adjacent to the edge of the window 100, it is likely that the definition of the arc required the adjustment of the degree of sweep. Two solid lines then join points 103, 104, and 105 and a dashed line joines 105 to 106. After the generation of the dashed line, the area-end routine closes the area by joining 106 and 101 and the closed areas are shaded in the appropriate color.

A visual inspection will show whether the marker symbols appear at the correct place and also whether any primitive extends beyond the window area. A further check can be made on the area shading to ensure there is no over or underspill of color.

The mechanism for generating the end of line markers and checking that the echo-prompt symbols have been correctly modified will now be described.

Each time that a primitive (line or arc) is generated the testcase generator adds the X, Y coordinates of the endpoints to an array. When the graphic block is sent out to the display terminal composite marker symbols are also sent to each of the predicted endpoints. Each marker symbol has a yellow and black portion to ensure that it will be visible whatever the background color.

The generation of the echo-prompt character and its checking is a little more complicated. When an alphanumeric block is being generated, the testcase generator maintains a dictionary for the block. Each declared field in the block has an entry in the dictionary. The entry will include the field attributes such as starting row and column, width depth, etc. As the number of data characters to be sent to the field is chosen randomly the dictionary entry will include this number and also which data character is the echo-prompt character. Thus, if a field is declared of length 12 and 7 alpha characters are to be put into the field with the 4th being the echo-prompt, the entry will reflect this information. It will also indicate whether the echo-prompt is to be overwritten or modified with a light pen.

When the alpha block is put out to the display the testcase generator dictionary will have an entry for all fields in that block. When the modified fields are then read back to the processor from the display, the generated testcase checks that all fields that were sent out with echo-prompt characters have been correctly modified and returned to the testcase. The tests to check the modification use the data held in the dictionary to determine the position of the prompt character.

While the invention has been particularly shown and described with reference to a preferred embodiment thereof, it will be understood by those skilled in the art that various changes in form and detail may be made therein without departing from the spirit and scope of the invention.

Having thus described my invention, what I claim as new and desire to secure by Letters Patent is:

1. In a digital data display system including a data processing device, a data store, a program executable in the data processing device for constructing alphanumeric and graphic data displays in the data store in response to statements, and a display terminal screen at which the display is presented,
   a testcase generator for generating testcase statements to be executed by said program for constructing displays, said testcase statements including statements for primary data to be displayed,
   wherein the improvement comprises,
   means in the testcase generator to generate statements for secondary data including marker symbols visually distinctive from said primary data and arranged to appear to test personnel in a selected separate position relative to the primary data on the display terminal when the program for constructing displays has executed properly,
   whereby when the primary data and secondary data are displayed during the execution of the testcase program by said means for constructing displays, if a marker symbol is not in its selected position relative to the primary data, an error condition in processing the testcase program by said program for constructing displays is indicated.

2. A testcase generator for a digital data display system as defined in claim 1 including means operable when the primary data to be displayed is in graphic form, to display a marker symbol at the end of each graphic line of primary data to be displayed.

3. A testcase generator for a digital data display system as defined in claim 1, including,
   means operable when the primary data to be displayed is in alphanumeric form to display a marker symbol at a preselected location in each field of data, and
   means for reading the terminal screen and testing for a predetermined character overstruck by test personnel at the preselected location of the marker symbol,
   whereby if the marker symbol is not in its predetermined position relative to the primary data, an error condition is indicated.

* * * * *